(12) United States Patent
Eckert et al.

(10) Patent No.: US 11,209,479 B2
(45) Date of Patent: Dec. 28, 2021

(54) STRESSING INTEGRATED CIRCUITS USING A RADIATION SOURCE

(71) Applicant: International Business Machines Corporation, Armonk, NY (US)

(72) Inventors: Martin Eckert, Moetzingen (DE); Matthias Pflanz, Holzgerlingen (DE); Otto Andreas Torreiter, Leinfelden-Echterdingen (DE); Juergen Pille, Stuttgart (DE)

(73) Assignee: International Business Machines Corporation, Armonk, NY (US)

( * ) Notice: Subject to any disclaimer, the term of this patent is extended or adjusted under 35 U.S.C. 154(b) by 260 days.

(21) Appl. No.: 16/667,278

(22) Filed: Oct. 29, 2019

(65) Prior Publication Data
US 2021/0123969 A1 Apr. 29, 2021

(51) Int. Cl.
*G01R 31/28* (2006.01)
*H01L 21/66* (2006.01)

(52) U.S. Cl.
CPC .......... *G01R 31/2874* (2013.01); *H01L 22/20* (2013.01)

(58) Field of Classification Search
CPC . G01R 31/2874; G01R 31/2881; H01L 22/20; H01L 22/12
USPC .......... 324/750.05, 750.03, 750.01, 537, 500
See application file for complete search history.

(56) References Cited

U.S. PATENT DOCUMENTS

| 8,288,177 | B2 | 10/2012 | Gaynes | |
|---|---|---|---|---|
| 8,661,382 | B2 | 2/2014 | Lamb | |
| 9,291,660 | B2 | 3/2016 | Paffrath | |
| 9,460,814 | B2 | 10/2016 | Dragula | |
| 10,191,099 | B2 | 1/2019 | Lee | |
| 2008/0068018 | A1* | 3/2008 | Massin | G01R 33/302 324/321 |
| 2017/0082682 | A1 | 3/2017 | Lee | |
| 2018/0174929 | A1* | 6/2018 | Tamanoi | H01L 21/78 |
| 2019/0369142 | A1* | 12/2019 | Treibergs | G01R 1/06722 |
| 2020/0355740 | A1* | 11/2020 | Tsai | G01R 1/0458 |
| 2021/0013070 | A1* | 1/2021 | Reed | H01L 21/324 |
| 2021/0132142 | A1* | 5/2021 | Tsai | G01R 31/2874 |

FOREIGN PATENT DOCUMENTS

| CN | 105974294 A | 9/2016 |
|---|---|---|
| CN | 207301134 U | 5/2018 |

\* cited by examiner

*Primary Examiner* — Giovanni Astacio-Oquendo
(74) *Attorney, Agent, or Firm* — Nicholas A. Welling; Daniel R. Simek

(57) ABSTRACT

Various aspects of the present invention disclose a test device that includes a retaining element retaining one or more nuclear radiation sources for performing a nuclear radiation stress test of data storage structures of integrated circuits on a wafer in a wafer prober. The retaining element includes one or more apertures for applying nuclear radiation from the one or more nuclear radiation sources to the data storage structures. The retaining element is configured for controlling the nuclear radiation applied via the one or more apertures. The controlling includes a varying of relative positions of the one or more nuclear radiation sources and the one or more apertures. Additional aspects of the present invention disclose a testing method, computer program product, and computer system for performing the nuclear radiation stress test. In an example aspect, embodiments of the present invention disclose a test device for a wafer prober.

20 Claims, 12 Drawing Sheets

FIG. 7A                    FIG. 7B

STRESSING INTEGRATED CIRCUITS USING A RADIATION SOURCE

BACKGROUND OF THE INVENTION

The present disclosure relates to the field of testing integrated circuits and, more specifically, to performing a nuclear radiation stress test of data storage structures of integrated circuits.

Wafer tests (e.g., tests performed during semiconductor device fabrication) are used to test integrated circuits on wafers for functional defects by applying test schemes to integrated circuits under test. Thus, wafer testing facilitates the determination of integrated circuits with functional defects, allowing the determined integrated circuits with functional defects to be sorted out. Wafer tests may ensure a high functional reliability of wafers being produced using in mass production.

SUMMARY

Various aspects of the present invention disclose a test device that includes a retaining element retaining one or more nuclear radiation sources for performing a nuclear radiation stress test of data storage structures of integrated circuits on a wafer in a wafer prober. Additional aspects of the present invention disclose a testing method, computer program product, and computer system for performing the nuclear radiation stress test as described by the subject matter of the independent claims. Further advantageous embodiments are described in the dependent claims. Embodiments of the present invention can be freely combined with each other, when not mutually exclusive.

In an example aspect, embodiments of the present invention disclose a test device for a wafer prober. The test device includes a retaining element retaining one or more nuclear radiation sources for performing a nuclear radiation stress test of data storage structures of integrated circuits on a wafer in the wafer prober. The retaining element includes one or more apertures for applying nuclear radiation from the one or more nuclear radiation sources to the data storage structures. The retaining element is configured for controlling the nuclear radiation applied via the one or more apertures. The controlling includes a varying of relative positions of the one or more nuclear radiation sources and the one or more apertures.

In a further aspect, embodiments of the present invention disclose a method, computer program product, and system for performing a nuclear radiation stress test of data storage structures of integrated circuits on a wafer in a wafer prober. The method comprises providing a probe card comprising a retaining element retaining one or more nuclear radiation sources. The retaining element includes one or more apertures for applying nuclear radiation from the one or more nuclear radiation sources to the data storage structures. The method further comprises executing a first stress test scheme. The method further includes providing the nuclear radiation via the one or more apertures during the executing of the first stress test scheme is controlled. The controlling comprises a varying of relative positions of the one or more nuclear radiation sources and the one or more apertures. The method further includes logging and counting fails of the data storage structures occurring during the executing of the first stress test scheme. The method further includes determining a soft error rate of the integrated circuits under test using the counted fails of the data storage structures occurring during the executing of the first stress test scheme.

BRIEF DESCRIPTION OF THE DRAWINGS

In the following, embodiments of the invention are explained in greater detail, by way of example only, making reference to the drawings in which.

DETAILED DESCRIPTION

Figure 1:
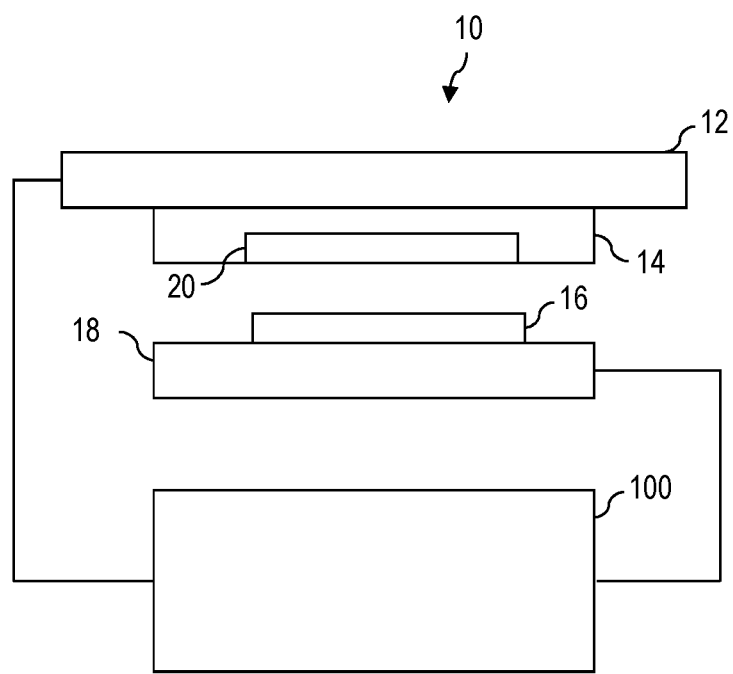
FIG. 1 depicts a schematic diagram illustrating an exemplary wafer prober for a nuclear radiation stress test of data storage structures on a wafer, in accordance with an embodiment of the present invention.

The descriptions of the various embodiments of the present invention are being presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

When introducing a new technology, test wafers may be produced comprising basic circuitry and structures which need to be analyzed in order to determine characteristics of the new technology. With new technology steps in chip manufacturing (e.g., stability of storage elements, like memory cells, latches, etc.) being in the presence of nuclear radiation may become a critical issue, such as radiation caused by cosmic radiation. Embodiments may provide a test device, a testing method, and a computer program product for supporting radiation stress tests using real nuclear radiation in a production test environment.

Embodiments of the present invention can provide the beneficial effects of providing a dedicated and well controlled test setup for a nuclear radiation stress tests of wafers. Additional embodiments can also provide the beneficial effect of enabling a testing of all chips on a wafer with respect to memory cell stability under radiation.

Embodiments of the present invention recognize that recent developments in semiconductor manufacturing (e.g., in 7 nm processes for the manufacturing of integrated circuits) may be more and more sensitive to radiation and thus be confronted with an increased the risk of radiation damage during operation (e.g., due to a lack of Silicon on Insulator (SOI)). SOI technology refers to the use of a layered silicon-insulator-silicon substrate in place of conventional silicon substrates in semiconductor manufacturing, especially microelectronics. SOI may have the beneficial effect of reducing parasitic capacitance and thereby improving performance. SOI-based devices may differ from conventional silicon-built devices in that a silicon junction is arranged above an electrical insulator (e.g., silicon dioxide or sapphire). Depending on the intended application, the choice of insulator varies. The insulating layer and topmost silicon layer can also vary widely with application.

The soft error rate (SER) refers to a rate at which a device or system encounters, or is predicted to encounter, soft errors. The SER is typically expressed as either the number of failures-in-time (FIT) or mean time between failures (MTBF). Embodiments of the present invention recognize that a typical 7 nm SER prediction may be up to 15 Fit/Mb or 20 Fit/Mb. For regular latch-based cell arrays the cosmic SER may be the dominant and thus relevant effect for SER. The FIT describes hits by alpha/beta/gamma particle in an array of 1 megabit of storage elements with the same cell type.

Embodiments of the present invention recognize that radiation damage may comprise soft errors as well as hard errors. A soft error may be an error with a signal or datum being incorrect. Secondary particles (e.g. from cosmic rays) may comprise charged alpha particle disturbing the distribution of electrons, when traveling through an integrated circuit. If the disturbance is large enough, then a digital signal may change from a 0 to a 1 or vice versa. A hard error, in contrast, is irrevocable (e.g., can include a single-event latch up, snapback, induced burnout, or gate rupture).

Embodiments of the present invention can also provide the beneficial effect of enabling an effective and efficient nuclear radiation stress test of wafers. For example, a statistical error rate and/or soft error rate may be determined defining a degree of robustness of the integrated circuits and in particular of the data storage structures under nuclear radiation, such as cosmic radiation.

A wafer refers to a thin slice of semiconductor (e.g., crystalline silicon) used for the fabrication of integrated circuits. The wafer may serve as a substrate for microcircuits built in and upon the wafer. A wafer may undergo a plurality of microfabrication processes, such as doping, ion implantation, etching, thin-film deposition of various materials, and photolithographic patterning. Finally, the individual microcircuits may be separated by wafer dicing and packaged as an integrated circuit.

A wafer testing method refers to a method for testing of integrated circuits present on a wafer. The integrated circuits are tested (e.g., for functional defects) by applying special test patterns to the wafers. A wafer testing performed during semiconductor device fabrication may comprise a testing of all individual integrated circuits of a wafer. The wafer testing may be performed before the wafer is sent to die preparation, i.e., before dicing and packaging.

A wafer prober refers to an electronic test system configured for performing a wafer testing. The wafer prober may be controlled by a computer system in order to perform an automatic testing of wafers.

For electrical testing the wafer prober may be equipped with a probe card. The probe card may be held in place whilst the wafer (e.g., vacuum-mounted on a wafer chuck) is moved into electrical contact. When a die or an array of dice has been electrically tested the wafer prober may move the wafer to the next die or array of dice, starting the next test. For example, the wafer prober may be configured for loading and unloading the wafers to be tested from a carrier or cassette. The wafer prober may comprise automatic pattern recognition optics configured for aligning the wafer with sufficient accuracy to ensure accurate registration between contact pads on the wafer and the tips of the probes of the probe card. For example, an optical sensor (e.g., a camera) in the prober may be used for optically determining the position of tips on the probe card as well as marks or pads on the wafer. The determined position information may be used for aligning the pads on wafer to the probe card contacts.

A probe card refers to an interface arranged between the electronic test system and the semiconductor wafer under test. A probe card may provide a set of microscopic contacts or probes. The probe card may be mechanically docked to the wafer prober and electrically connected to the wafer under test. The probe card may be configured to provide an electrical path between the wafer prober and the integrated circuits on the wafer under test, thereby enabling a testing and validation of the integrated circuits at wafer level. For example, the testing may be performed before the integrated circuits are diced and packaged. The probe card may comprise a printed circuit board (PCB) and a plurality of contact elements, e.g., metallic contact elements.

The probe card may provide a custom connector that takes a universal signal pattern of a wafer prober and translates the signals to connect to electrical pads on the wafer under test. Thus, the same wafer prober may be used for testing wafers with different types of integrated circuits by using different probe cards, each probe card being customized for one of the different types of integrated circuits. For example, a probe card may be a needle type, vertical type, or micro electromechanical system (MEMS) type of probe card, depending on shapes and forms of contact elements of the probe card.

When all test schemes pass for a specific die, the position of the die may be remembered for later use during packaging. Non-passing integrated circuits may be marked, or the information of passing/non-passing may be stored in a file, referred to as a wafer map. The wafer map may categorize the passing and non-passing dies (e.g., using bins). A bin may be defined as a passing or non-passing die. The wafer map may then be sent to a die attachment process, which may only pick up the passing integrated circuits by selecting the bin number of passing dies.

An aperture refers to an opening to which the propagation of nuclear radiation is limited. The opening may be opened (i.e. unfilled) or filled with a martial transparent for the nuclear radiation.

According to various embodiments of the present invention, an implementation of a test device described herein, utilized with a probe card and/or wafer prober, allowing testing of wafers with and without radiation. Embodiments of the present invention can also provide the beneficial effect of acquiring mass testing data enabling statistical evaluations. In other words, test data may not only be acquired for a single device under test (DUT) (i.e., data storage structures of a single integrated circuit and/or wafer), but a large number of DUTs, in order to assess the DUTs chips, memories, latches, with respect to a statistical error rate (e.g. a soft error rate). Embodiments of the present invention may thus have the beneficial effect of enabling of mass data acquisition sufficient for statistical evaluations.

According to embodiments of the present invention, pad cage structures may be used for accessing circuitry on the same die or wafer independently from each other. These pad cage structures may be reused from a front-end perspective to lower cost for test. According to embodiments of the present invention, a probe card may be provided for such pad cage structures and used for automatic wafer test.

According to embodiments of the present invention, the wafers under test may be a test wafers fabricated as prototypes of new technologies. According to additional embodiments of the present invention, the nuclear radiation stress tests may be performed on production level wafers. According to further embodiments of the present invention, each chip on a wafer may be stressed while testing.

In addition, embodiments of the present invention can provide the beneficial effect of limiting nuclear radiation applied to the wafer to dedicated areas of the wafer, such as to data storage structures to be tested. Embodiments of the present invention can also provide the beneficial effect that, by aligning a nuclear radiation source of the one or more nuclear radiation sources with an aperture of the one or more apertures over a data storage structure under test, the nuclear radiation applied by the respective nuclear radiation source via the respective aperture may be maximized. Positioning the respective nuclear radiation source out of alignment with the respective aperture, the nuclear radiation applied by the respective nuclear radiation source via the respective aperture may be reduced. Positioning the nuclear radiation source far enough out of alignment with the respective aperture, the amount of nuclear radiation from the respective nuclear radiation source may be reduced to zero. The positioning in alignment with the aperture may be considered as an operation mode, the positioning out of aliment may be considered out-of-operation mode. Thus, by aligning and unaligning testing may be controlled if a nuclear radiation source is used during the stress test to expose a data storage structure under test to nuclear radiation.

Embodiments of the present invention can also provide the beneficial effect of enabling a selecting of specific nuclear radiation sources to be used during the stress test by aligning the respective nuclear radiation sources with apertures. For example, the nuclear radiation sources may be aligned in sequence one after another with an aperture. Thus, nuclear radiation from the nuclear radiation sources may be applied in sequence during the stress test. For example, the aperture may be aligned in sequence with the nuclear radiation sources.

Embodiments of the present invention can also adjust the nuclear radiation applied by using different types of nuclear radiation sources. The different types of nuclear radiation sources may radiate different types of nuclear radiation and/or combination thereof. The different types of nuclear radiation sources may have different radiation intensities. The radiation of the different nuclear radiation source may have different energy levels.

Further embodiments of the present invention can also adjust the nuclear radiation applied by attenuating one or more of the nuclear radiation sources. In additionally embodiments of the present invention can adjust the nuclear radiation applied by varying the distance of the nuclear radiation sources and the data storage structures under test.

According to another embodiment of the present invention, the retaining element includes a housing. The housing includes a shielding material configured for shielding the nuclear radiation from the one or more nuclear radiation sources. The one or more apertures are provided in the housing. Embodiments of the present invention can also have the beneficial effect that the hosing provides a safe storage container for storing the one or more nuclear radiation sources if the test device is out of operation (i.e., the nuclear radiation sources are out of alignment with any of the one or more apertures). During storage, the housing may effectively shield the surrounding form the nuclear radiation radiated from the one or more nuclear radiation sources.

Embodiments of the present invention may have the beneficial effect that the aperture may effectively limit the and adjust the direction, in which nuclear radiation radiated from the one or more nuclear radiation sources is applied to the wafer under test. According to embodiments of the present invention, nuclear radiation may only able to leave the housing via the one or more apertures. According to additional embodiments of the present invention, nuclear radiation may only able to leave the housing via an aperture, if one of the one or more nuclear radiation sources is aligned with the respective aperture.

Example embodiments of the present invention utilize a shielding material of lead. Embodiments of the present invention may have the beneficial effect of utilizing lead to provide affective shielding for the nuclear radiation of any of the one or more nuclear radiation sources. According to another embodiment of the present invention, the housing is provided in form of a lead tube and the one or more nuclear radiation sources may be arranged on a wire comprised by the lead tube. The wire may be movable laterally and/or rotationally in the lead tube. By laterally and/or rotationally moving the wire in the lead tube one or more of the nuclear radiation sources may be aligned with one or more of the apertures. Embodiments of the present invention can provide the beneficial effect of providing a changeable dose in the test setup (e.g., by laterally and/or rotationally moving the wire). The wire may be coated with different nuclear radiative sources along its longitudinal direction.

Embodiments of the present invention can also provide the beneficial effect of enabling a changing of the type of nuclear radiation source used for testing at test time for different test runs by moving the wire forth and/or back. Further embodiments of the present invention can have the beneficial effect of providing a parking opposition for sections of the wire with nuclear radiation sources, when moving the wire laterally to an outer position (i.e. a parking position). This parking position may ensure a save state for handling the radiation source. According to additional embodiments of the present invention, the parking position may be distanced apart from the electrical connections of the probe card.

According to embodiments of the present invention, the retaining element provide different levels of attenuation for attenuating the nuclear radiation from the one or more nuclear radiation sources. Embodiments of the present invention can also have the beneficial effect that the nuclear radiation applied to the data storage structures under test may be varied by varying the attenuation of the nuclear radiation sources (e.g. by using nuclear radiation sources with different attenuations).

According to further embodiments of the present invention, the providing of the different levels of attenuation includes covering the at least some of the one or more nuclear radiation sources with different attenuating elements. Attenuation elements may be provided in form of an attenuation foils adhered on the nuclear radiation sources. For example, the attenuations foils may be applied in form of sticking foils. The different attenuating elements may include different attenuating materials and/or different thicknesses. For example, the attenuating materials may include lead.

Embodiments of the present invention can also have the beneficial effect of providing reusable support elements, which are applied with a removable, sticking foil comprising one or more nuclear radiation sources. According to embodiments of the present invention, the providing of the different levels of attenuation includes providing sections of the housing with different thicknesses. A small thickness of the housing may result in a less effective/partial shielding (i.e., in an attenuation rather than a complete shielding) by the section of the housing having the small thickness.

According to embodiments of the present invention, the providing of the different levels of attenuation includes providing a mask. Embodiments of the present invention can provide the beneficial effect of enabling to filter and/or limit radiation using a mask. The mask may include an attenuation material (e.g., lead) for attenuation of nuclear radiation. The mask may be provided in form of an electrically movable plate. According to additional embodiments of the present invention, the mask may be provided in form of the segment of the housing comprising the one or more apertures. Embodiments of the present invention may have the beneficial effect of allowing for enabling and disabling radiation and/or disabling and enabling attenuation of radiation as needed.

According to alternative embodiments of the present invention, the thickness of the housing is sufficiently large for ensuring a complete shielding of the nuclear radiation from the one or more nuclear radiation sources except for the one or more apertures.

According to embodiments of the present invention, the one or more apertures are covered with transparent covering elements transparent to the nuclear radiation from the one or more nuclear radiation sources. Thus, all openings of in the housing may be covered. Embodiments of the present invention can provide the beneficial effect of preventing powder particles escaping from the one or more nuclear radiation sources to escape from the retaining element. For example, the covering elements may be made from mica which is transparent for alpha radiation.

According to additional embodiments of the present invention, the one or more apertures are covered with a covering attenuation element attenuating the nuclear radiation from the one or more nuclear radiation sources. In order to implement different levels of attenuation, different covering attenuating elements comprising different attenuating materials and/or different thicknesses may be used. For example, the attenuating materials of the covering attenuation element may include lead.

According to embodiment of the present invention, the retaining element retains the one or more nuclear radiation sources at different distances perpendicularly to a plane in which the at one or more apertures are arranged. Embodiments of the present invention can provide the beneficial effect that, by varying the distances of nuclear radiation sources perpendicularly to the plane in which the at one or more apertures are arranged, the distances of the respective nuclear radiation sources to the data storages structures under test may be varied. A varying of the distances of the nuclear radiation sources to the data storages structures under test may result in a varying of the radiation intensity applied to the respective data storage structures under test.

According to embodiments of the present invention, some of the one or more nuclear radiation sources are arranged at the same distance perpendicularly to the plane in which the at one or more apertures. According to other embodiments of the present invention, all of the one or more nuclear radiation sources are arranged at different distances perpendicularly to the plane in which the at one or more apertures are arranged.

According to additional embodiments of the present invention, the nuclear radiation radiated from the one or more nuclear radiation sources comprises one or more of the following types of radiation: alpha radiation, beta radiation, gamma radiation. Embodiments of the present invention can provide the beneficial effect that different types and/or combinations of types of radiation may be selectable and usable for the nuclear radiation stress test.

According to embodiments of the present invention, alpha radiation may be used to generate gamma radiation via interactions of the alpha radiation with the wafer under test. The resulting beta radiation generated within the wafer under test may be used for the stress test. Thus, a nuclear radiation stress test with gamma radiation may be performed without using an active gamma radiation source.

According to embodiments of the present invention, the at least one of the one or more of the nuclear radiation sources comprise 232Th. Thorium may provide alpha and beta radiation, since 232Th decay to 228Ra results in alpha and beta radiation. The half-value period is $1.405 \times 10^{10}$ a with decay energy of 4,083 E/MeV. 232Th may be used as powder on a foil as a source of radiation, i.e., an alpha and beta source at the same time.

According to embodiments of the present invention, the retaining element comprises a support element for supporting the one or more nuclear radiation sources. Embodiments of the present invention can also provide the beneficial effect that the nuclear radiation sources may be provided on the support element.

According to further embodiments of the present invention, the support element with the one or more nuclear radiation sources is movable within the housing relative to the one or more apertures. Embodiments of the present invention can provide the beneficial effect that, by moving the support element, one or more of the nuclear radiation sources may be aligned or unaligned with one or more of the apertures. Thus, by moving the support element the nuclear radiation applied via the one or more apertures may be controlled. Example embodiments of the present invention can select which nuclear radiation sources are used and based on fix positions of the one or more apertures where the respective which nuclear radiation sources are used (i.e., for which data storage structures they are used).

According to embodiments of the present invention, the fixed positions of the one or more apertures may be adjusted to the positions of data storage structures of the integrated circuits on the wafer under test.

According to embodiments of the present invention, at least a segment of the housing that includes the one or more apertures is movable relative to the support element with the one or more nuclear radiation sources. Embodiments of the present invention can provide the beneficial effect that, by moving the movable segment of the housing, one or more of the nuclear radiation sources may be aligned or unaligned with one or more of the one or more apertures comprised by the respective segment. Thus, by moving the movable segment of the housing the nuclear radiation applied via the one or more apertures may be controlled. For example, embodiments of the present invention can which nuclear radiation sources are used and, based on the fixed positions of the one or more nuclear radiation sources, where the respective which nuclear radiation sources are used (i.e., for which data storage structures).

According to additional embodiments of the present invention, the fixed positions of the one or more nuclear radiation sources may be adjusted to the positions of data storage structures of the integrated circuits on the wafer under test. According to embodiments of the present invention, the one or more nuclear radiation sources are provided by a powder of one or more nuclear radiative materials sticking to a sticking element adhering to the support element. Embodiments of the present invention can provide the beneficial effect of providing a simple and secure implementation of nuclear radiations sources may be provided. In example embodiments, the sticking element is a sticking foil.

In example embodiments of the present invention, the support element is a wire. Embodiments of the present invention can provide the beneficial effect of providing a support element that is simple to be handled and requiring only a small amount of space. The wire may for example be coated with a nuclear radiation material, such as thorium as an alpha and beta source.

According to embodiments of the present invention, the support element includes a support surface. The one or more nuclear radiation sources are arranged on the support surface according to a first pattern matching a second pattern of an arrangement of the data storage structures on the wafer to be tested. Embodiments may have the beneficial effect that the first pattern may be adjusted to the second pattern (i.e., for each type of wafer and/or integrated circuits a specific support element may be used), individually configured for nuclear radiation tests of this type of wafer and/or integrated circuits.

According to embodiments of the present invention, the support surface includes a checkerboard structure. The checkerboard structure includes a plurality of confined fields. The confined fields of the checkboard structure are selectively filled with the one or more nuclear radiation sources according to the first pattern. Embodiments of the present invention can provide the beneficial effect that a checkerboard structure may be used to specifically designed a first pattern matching the second pattern of an arrangement of the data storage structures on the wafer to be tested. Thus, the nuclear radiation sources distributed according to the first pattern may each be aligned with (i.e., located above) a data storage structure to be tested. The confined fields may provide individual boxes provided for receiving nuclear radiation sources.

According to further embodiments of the present invention, the one or more apertures are arranged according to a third pattern matching the second pattern of the arrangement of the data storage structures on the wafer to be tested. Embodiments of the present invention can provide the beneficial effect that the apertures may be distributed such that they form a pattern (i.e., the third pattern) matching the second pattern of an arrangement of the data storage structures on the wafer to be tested. Thus, the apertures distributed according to the third pattern may each be aligned with (i.e., located above) a data storage structure to be tested.

According to embodiments of the present invention, the retaining element includes a probe card with electrical contacts configured for establishing an electrical connection with electrical contacts of the integrated circuits on the wafer. Embodiments of the present invention can provide the beneficial effect of incorporating the retaining element in the probe card. Thus, a distance between the nuclear sources provided by the retaining element and the data storage structure provided by the integrated circuits on the wafer may be minimized. In addition, a compact integration may be enabled. Furthermore, the retaining element is changeable with changing the probe card. Embodiments may have the beneficial effect of requiring no special hardware change beyond an adjustment of the probe card for a test-board front end.

According to embodiments of the present invention, the test device includes the probe card. According to additional embodiments of the present invention, the retaining element may further comprise one or more shutters for controlling the size of the one or more apertures.

According to embodiments of the present invention, the test device includes an air flow system configured for extracting powder particles escaping from the one or more nuclear radiation sources with a filter configured for capturing the extracted powder particles. Embodiments of the present invention can provide the beneficial effect of efficiently and effectively preventing that powder particles escaping from the one or more nuclear radiation sources being released to the surroundings of the test device. Thus, any danger from using nuclear radiation sources may be prevented.

According to additional embodiments of the present invention, the test device includes a wafer prober. The wafer prober includes a computer system for controlling the wafer prober to perform the nuclear radiation stress test. The computer system comprises a processor and a memory storing program instructions. The execution of the program instructions by the processor causes the computer system to control the wafer prober to execute a stress test scheme. The nuclear radiation applied via the one or more apertures during the executing of the stress test scheme is controlled. The controlling includes the varying of relative positions of the one or more nuclear radiation sources and the one or more apertures. Fails of the data storage structures occurring during the executing of the stress test scheme are logged and counted. A statistical error rate (e.g., a soft error rate) of the integrated circuits under test is determined using the counted fails of the data storage structures occurring during the executing of the stress test scheme. Embodiments of the present invention can also provide the beneficial effect of proving an effective and efficient way of determining soft error rates under nuclear radiation for wafers.

According to various embodiments of the present invention, the computer system further is configured to implement any embodiment of the nuclear radiation stress test described herein.

Various embodiments of the present invention can provide a nuclear radiation sources free probe card. The probe card that includes the retaining element may be replaced by the nuclear radiation sources free probe card or vice versa. The execution of the program instructions by the processor may cause the computer system to control the wafer prober to execute a second stress test scheme using the nuclear radiation sources free probe card.

As an alternative, the probe card that includes the retaining element may be used for executing the second stress test scheme with all the nuclear radiation sources and/or all the apertures in a position such that no nuclear radiation is applied to the data storage structures to be tested. Fails of the data storage structures occurring during the executing of the second stress test scheme are logged and counted. The determining of the statistical error rate (e.g., a soft error rate) of the integrated circuits under test further comprises using the counted fails of the data storage structures occurring during the executing of the second stress test scheme. For example, the counted fails of the data storage structures occurring during the executing of the first and second stress test scheme may be compared with each other.

According to various embodiments of the present invention, the testing method further is configured to implement any embodiment of the nuclear radiation stress test described herein.

According to embodiments of the present invention, the data storage structures can include one or more of the following structures: a latch, a register file, and a random-access memory cell. According to further embodiments of the present invention, the random-access memory cell is a static random-access memory (SRAM) cell or a direct random-access memory (DRAM) cell. Embodiments of the present invention can provide the beneficial effect of enabling an analysis of random transistor process variations (e.g., ionization or ratio between pull-up and pull-down/pass gate transistors in SRAM cell implementations).

According to further embodiments of the present invention, the test method further includes providing a nuclear radiation sources free probe card. The probe card that includes the retaining element may be replaced by the nuclear radiation sources free probe card or vice versa. A second stress test scheme is executed. As an alternative, the probe card that includes the retaining element may be used for executing the second stress test scheme with all the nuclear radiation sources and/or all the apertures in a position such that no nuclear radiation is applied to the data storage structures to be tested. Fails of the data storage structures occurring during the executing of the second stress test scheme are logged and counted. The determining of the statistical error rate (e.g., a soft error rate) of the integrated circuits under test further includes using the counted fails of the data storage structures occurring during the executing of the second stress test scheme. For example, the counted fails of the data storage structures occurring during the executing of the first and second stress test scheme may be compared with each other.

According to embodiments of the present invention, the nuclear radiation stress test may include a retention test with variable retention time settings under various environmental conditions, such as voltages, temperatures, frequencies, etc. According to additional embodiments of the present invention, the computer program product further is configured to implement any embodiment of the nuclear radiation stress test described herein.

FIG. 1 depicts an exemplary wafer prober 10 configured for an automatic testing of wafers 16. Computer system 100 can control the wafer prober 10. The wafer prober 10 can include a test board 12 configured for receiving a probe card 14. According to example embodiments, a retaining element with nuclear radiation sources (i.e., a retaining element 20), may include the probe card 14. The probe card 14 may be configured to perform an automatic nuclear radiation stress test of the wafer 16 provided in the wafer prober 10 for the nuclear radiation stress test. The probe card 14 may be held in place whilst the wafer 16 (e.g., vacuum-mounted on a wafer chuck of a wafer stage 18), is moved into electrical contact with the probe card 14.

When a die or an array of dice has been electrically tested, the wafer prober 10 may move the wafer 16 to the next die or array of dice, starting the next test. The wafer prober 10 may, e.g., be configured for loading and unloading the wafers 16 to be tested from a carrier or cassette. The wafer prober 10 can include automatic pattern recognition optics configured for aligning the wafer 16 with sufficient accuracy to ensure accurate registration between contact pads on the wafer 16 and the tips of electrical contacts of the probe card 14. For example, an optical sensor (e.g., a camera) in the wafer prober 10 may be used for optically determining the position of tips on the probe card 14 as well as marks or pads on the wafer 16. This position information may be used for aligning the pads on wafer 16 to the electrical contacts of the probe card 14.

Figure 2:
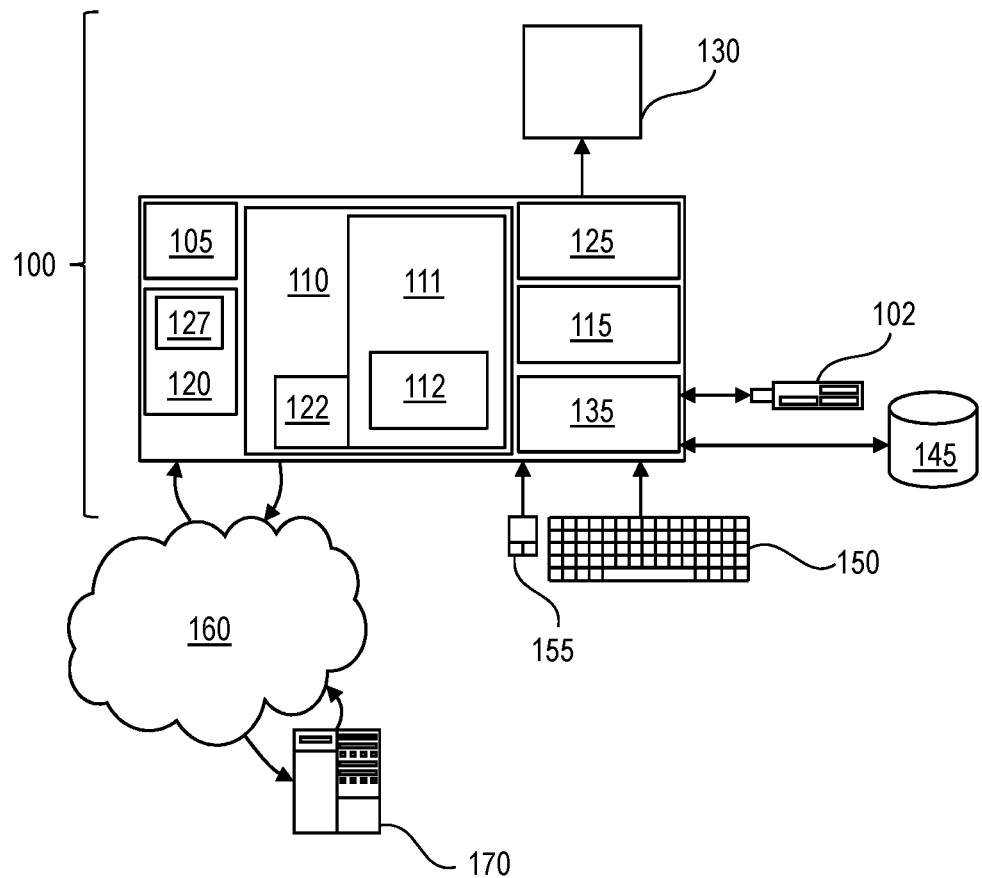
FIG. 2 depicts a schematic diagram illustrating an exemplary computer system for controlling the wafer prober, in accordance with an embodiment of the present invention.

FIG. 2 depicts an exemplary computer system 100 configured for controlling the wafer prober 10 of FIG. 1 to perform a nuclear radiation tress test, in accordance with embodiments of the present invention. In various embodiments of the present invention, the computer system 100 operates to execute method of performing a nuclear radiation stress test of data storage structures, such as exemplary method discussed in further detail with regard to FIG. 12 and FIG. 13. It will be appreciated that the computer system 100 described herein may be any type of computerized system comprising a plurality of plurality of processor chips, a plurality of memory buffer chips and a memory. The computer system 100 may for example be implemented in form of a general-purpose digital computer, such as a personal computer, a workstation, or a minicomputer. According to various embodiments, the computer system 100 may be customized for and integrated in the wafer prober 10, in accordance with embodiments of the present invention.

In example embodiments, in terms of hardware architecture, as shown in FIG. 2, the computer system 100 includes a processor 105, memory (main memory) 110 coupled to a memory controller 115, and one or more input and/or output (I/O) devices (or peripherals) 102 and I/O devices 145 that are communicatively coupled via a local input/output controller 135. The input/output controller 135 can be, but is not limited to, one or more buses or other wired or wireless connections, as is known in the art. The input/output controller 135 may have additional elements, which are omitted for simplicity, such as controllers, buffers (caches), drivers, repeaters, and receivers, to enable communications. Further, the local interface may include address, control, and/or data connections to enable appropriate communications among the aforementioned components.

The processor 105 is a hardware device for executing software, particularly that stored in memory 110. The processor 105 can be any custom made or commercially available processor, a central processing unit (CPU), an auxiliary processor among several processors associated with the computer system 100, a semiconductor-based microprocessor (in the form of a microchip or chip set), a macroprocessor, or generally any device for executing software instructions, in accordance with various embodiments of the present invention.

The memory 110 can include any one or combination of volatile memory modules (e.g., random access memory (RAM, such as DRAM, SRAM, SDRAM, etc.)) and nonvolatile memory modules (e.g., ROM, erasable programmable read only memory (EPROM), electronically erasable programmable read only memory (EEPROM), or programmable read only memory (PROM)). Note that the memory 110 can have a distributed architecture, where additional modules are situated remote from one another, but can be accessed by the processor 105.

The software in memory 110 may include one or more separate programs, each of which comprises an ordered listing of executable instructions for implementing logical functions, notably functions involved in embodiments of this invention. For example, the executable instructions may be configured to control the wafer prober 10 of FIG. 1 to execute a nuclear radiation stress test of data storage structures of integrated circuits on wafer 16, in accordance with various embodiments of the present invention. The software in memory 110 may further include a suitable operating system (OS) 111. The OS 111 essentially controls the execution of other computer programs, such as possibly software 112.

If the computer system 100 is a personal computer (PC), workstation, intelligent device or the like, the software in the memory 110 may further include a basic input output system (BIOS) 122. The BIOS is a set of essential software routines that initialize and test hardware at startup, start the OS 111, and support the transfer of data among the hardware devices. The BIOS is stored in ROM so that the BIOS can be executed when the computer system 100 is activated.

When the computer system 100 is in operation, the processor 105 is configured for executing software 112 stored within the memory 110, to communicate data to and from the memory 110, and to generally control operations of the computer system 100 pursuant to the software. The methods described herein and the OS 111, in whole or in part, but typically the latter, are read by the processor 105, possibly buffered within the processor 105, and then executed.

Software 112 may further be provided stored on any computer readable medium, such as storage 120, for use by or in connection with any computer related system or method. The storage 120 may comprise a disk storage such as hard disk drive (HDD) storage. According to embodiments, the software 112 may comprise program instructions to perform the stress tests, e.g., defining one or more stress test schemes.

In exemplary embodiments, a conventional keyboard 150 and mouse 155 can be coupled to the input/output controller 135. Other output devices such as the I/O devices 145 may include input devices, for example but not limited to a printer, a scanner, microphone, and the like. Finally, the I/O devices 102 and 145 may further include devices that communicate both inputs and outputs, for instance but not limited to, a network interface card (NIC) or modulator/demodulator (for accessing other files, devices, systems, or a network), a radio frequency (RF) or other transceiver, a telephonic interface, a bridge, a router, and the like. The I/O devices 102 and 145 may be any generalized cryptographic card or smart card known in the art.

The computer system 100 can further include a display controller 125 coupled to a display 130. In exemplary embodiments, the computer system 100 can further include a network interface for coupling to a network 160, such as an intranet or the Internet. The network can be an IP-based network for communication between the computer system 100 and any external server (e.g., server 170, another client and the like via a broadband connection, etc.).

The network 160 transmits and receives data between the computer system 100 and server 170. In exemplary embodiments, network 160 may be a managed IP network administered by a service provider. The network 160 may be implemented in a wireless fashion, such as using wireless protocols and technologies (e.g., Wi-Fi, WiMAX, etc.). The network 160 may also be a packet-switched network such as a local area network, wide area network, metropolitan area network, Internet network, or other similar type of network environment. The network may be a fixed wireless network, a wireless local area network (LAN), a wireless wide area network (WAN) a personal area network (PAN), a virtual private network (VPN), intranet or other suitable network system and includes equipment for receiving and transmitting signals. The server 170 may for example provide program instructions to perform the stress tests. The program instruction may define one or more stress test schemes and/or receive results of the stress test performed by the wafer prober 10.

Figure 3A:
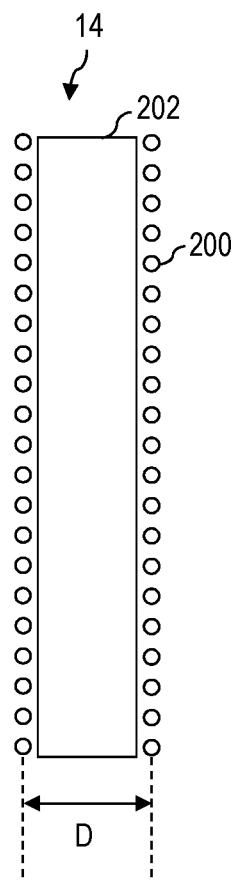
FIG. 3A and FIG. 3B depict schematic diagrams illustrating an exemplary probe card and exemplary data storage structures on a wafer, in accordance with an embodiment of the present invention.

FIG. 3A depicts a bottom view of an exemplary probe card 14. The probe card 14 may comprise a plurality of electrical contacts 200 (e.g., needles) to contact integrated circuits provided on a wafer 16. The electrical contacts 200 may be arranged in two parallel rows (e.g., spaced apart from each other by a distance D). The probe card 14 may further comprise one or more nuclear radiation sources 202. For example, a foil with nuclear radiating element(s) (e.g., in form of a fine powder stuck on tape) may be stuck to the probe card 14.

Figure 3B:
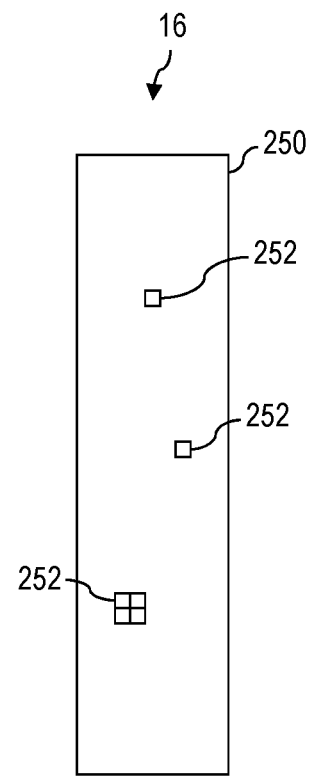

FIG. 3B depicts a top view of an exemplary wafer 16. The wafer 16 may comprise integrated circuits 250 (e.g., forming chips), which comprise one or more data storage structures 252, such as latches, register files, and a random-access memory cells (e.g., SRAM cells). According to embodiments of the present invention, the nuclear radiation source, as well as an aperture, may be large enough to cover a plurality and/or all of the data storage structures 252 of the integrated circuits 250. According to additional embodiments, the nuclear radiation source 202 large enough to cover all of the data storage structures 252 of the integrated circuits 250 may be covered by a mask (not shown) comprising on or more apertures aligned with the one or more data storage structures 252 of the integrated circuits 250. According to embodiments, the mask may be part of a housing of a retaining element retaining the nuclear radiation sources 202 (e.g., a foil with the nuclear radiation sources 202) may be stuck to a support element of the retaining element. According to further embodiments, the mask may be movable to align an aperture with one or more of the data storage structures 252.

Figure 4:
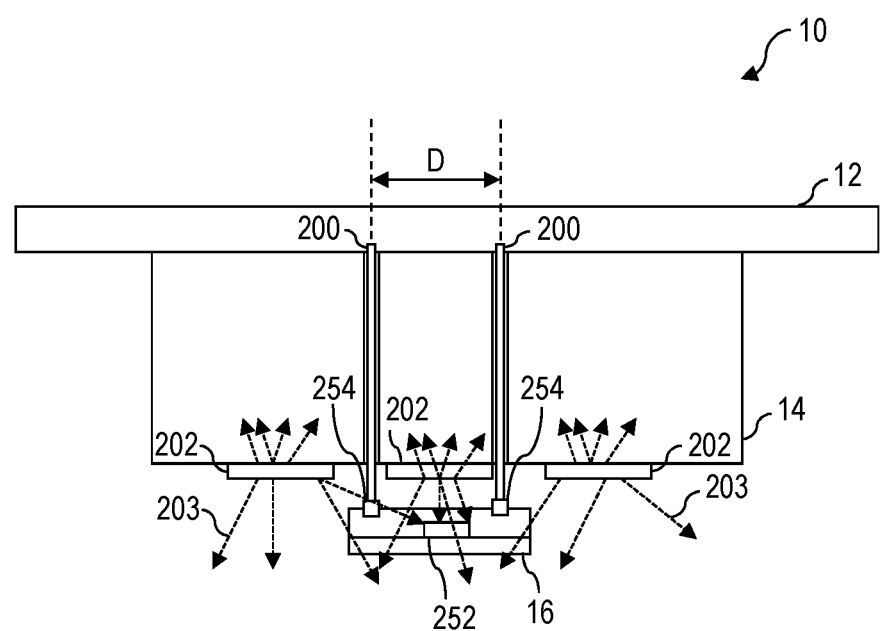
FIG. 4 depicts a schematic diagram illustrating an exemplary wafer prober, in accordance with an embodiment of the present invention.

FIG. 4 depicts a cross section of the wafer prober 10 through an aperture. The wafer prober 10 comprises a test board 12 holding a probe card 14. The probe card 14 comprises electrical contacts 200 (e.g., in form of needles) configured to establish an electrical contact with electrical contact 254 of integrated circuits on a wafer 16 to be tested in the wafer prober 10. The integrated circuits comprise one or more data storage structures 252. Nuclear radiation sources 202 (e.g., in form of a fine powder stuck on tape), may be stuck to the probe card 14. The nuclear radiation 203 (e.g., alpha, beta, and/or gamma radiation), from the nuclear radiation sources 202 may be used to perform a nuclear radiation stress test of the one or more data storage structures 252.

Figure 5A:
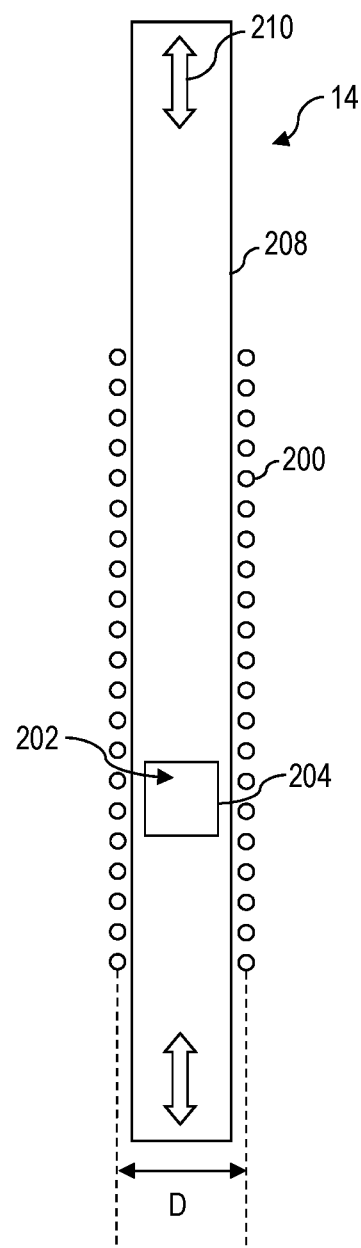
FIG. 5A and FIG. 5B depict schematic diagrams illustrating an exemplary probe card and exemplary data storage structures on a wafer, in accordance with an embodiment of the present invention.
Figure 5B:
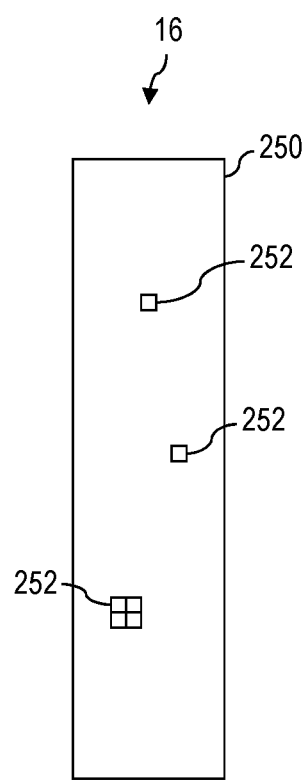

FIG. 5A depicts the probe card of FIG. 3A with a mask 208 comprising an aperture 204. The mask may comprise a shielding material shielding the nuclear radiation 203 from the nuclear radiation sources 202. For example, the mask 208 may be provided by a lead or lead coated stripe configured to filter and attenuate the radiation rates of the radiation sources 202. In various embodiments, only nuclear radiation 203 from a section of the nuclear radiation source 202 aligned with aperture 204 may be applied to the wafer 16. Nuclear radiation 203 from other sections of the nuclear radiation source 202 covered by mask 208 may be shielded. The mask 208 is movable along the direction 210. FIG. 5B shows the wafer 16 with data storage structures 252 of FIG. 3B. By moving the mask 208 along the direction 210, the aperture 204 may be aligned with one of the data storage structures 252 of the wafer 16 in order to expose these structures to nuclear radiation from the nuclear radiation source 202.

Figure 6:
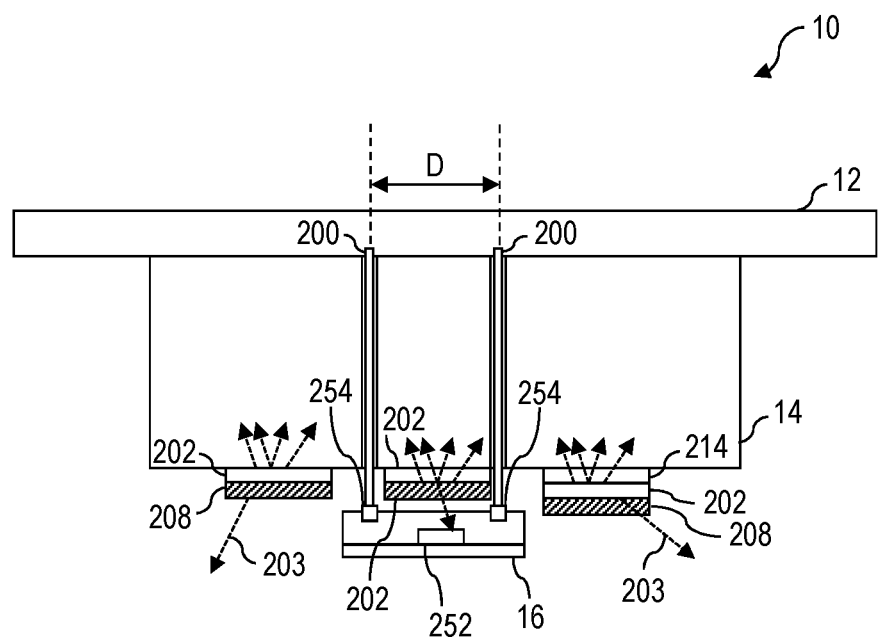
FIG. 6 depicts a schematic diagram illustrating an exemplary wafer prober, in accordance with an embodiment of the present invention.

FIG. 6 depicts a cross section of the wafer prober 10. In addition to the features depicted in FIG. 4, the wafer prober 10 of FIG. 6 comprises the mask 208. In various embodiments, due to the shielding, only nuclear radiation 203 from a section of the nuclear radiation source 202 aligned with aperture 204 may be applied to the wafer 16. One or more of the nuclear radiation sources 202 may in addition be arranged on a pedestal element 214. Using pedestal elements 214, the distance of the nuclear radiation sources 202 from the data storage structures 252 may be varied. Varying the distance of the nuclear radiation sources 202 from the data storage structures 252 may result in a varying of the radiation intensity applied to the respective data storage structures 252.

Figure 7:
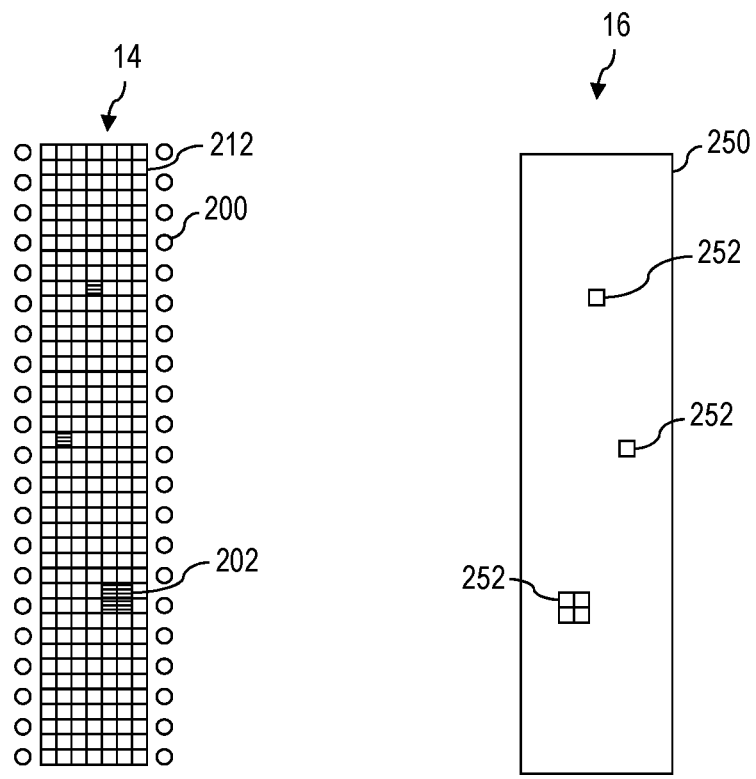
FIG. 7A and FIG. 7B depict schematic diagrams illustrating an exemplary probe card and exemplary data storage structures on a wafer, in accordance with an embodiment of the present invention.

FIG. 7A depicts a probe card 14 with electrical contacts 200, which comprise a checkerboard structure 212. The checkerboard structure 212 comprises a plurality of confined fields. The confined fields of the checkboard structure 212 are selectively filled with the nuclear radiation sources 202 according to a first pattern. The first pattern according to which the nuclear radiation sources 202 are arranged in the checkboard structure 212 matches a second pattern of an arrangement of the data storage structures 252 on the wafer 16 to be tested as depicted in FIG. 7B. FIG. 7B depicts the wafer 16 with data storage structures 252 of FIG. 3B.

Figure 8:
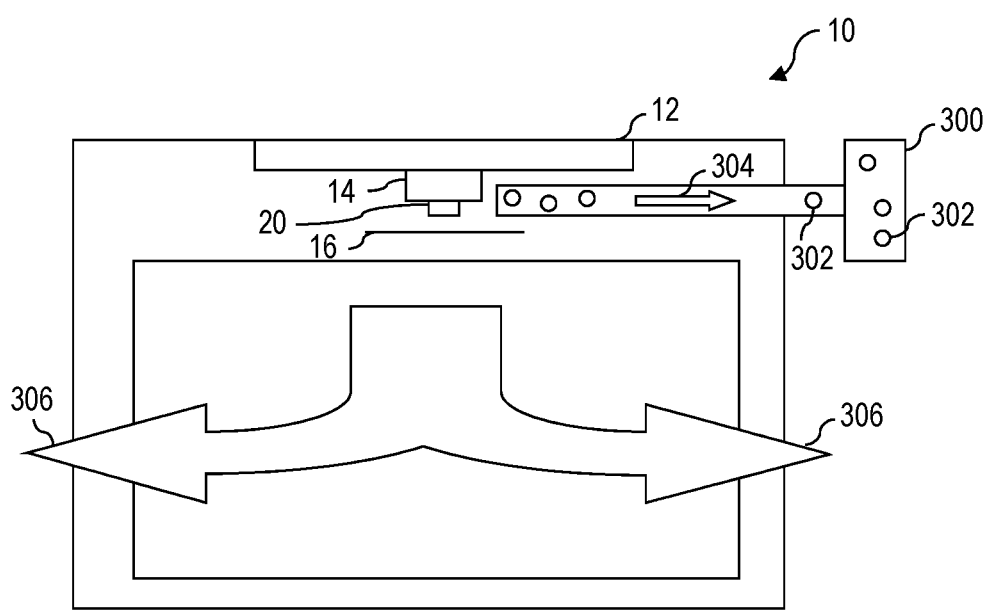
FIG. 8 depicts a schematic diagram illustrating an exemplary wafer prober with an air flow system configured for extracting and capturing nuclear radiation powder particles, in accordance with an embodiment of the present invention.

FIG. 8 depicts a cross section of the wafer prober 10. The wafer prober 10 comprises, in addition to the test board 12 and the probe card 14, an air flow system 300. The air flow system 300 is configured for extracting powder particles 302 escaping from the one or more nuclear radiation sources provided by the retaining element 20. The air flow system 300 may be configured for capturing powder particles 302 extracted in the direction 304, e.g. using a filter. The wafer prober 10 may have a higher pressure inside than outside the wafer prober 10. Thus, the risk that powder particles 302 escaping from the one or more nuclear radiation sources to the outside due to the higher pressure in the inside may be high. In order to minimize this risk, the powder particles 302 may be actively extracted and captured by the air flow system 300 in order to prevent the risks arising from ¬µm powder particles otherwise escaping to the outside following the flow of air 306 of the wafer prober 10.

Figure 9:
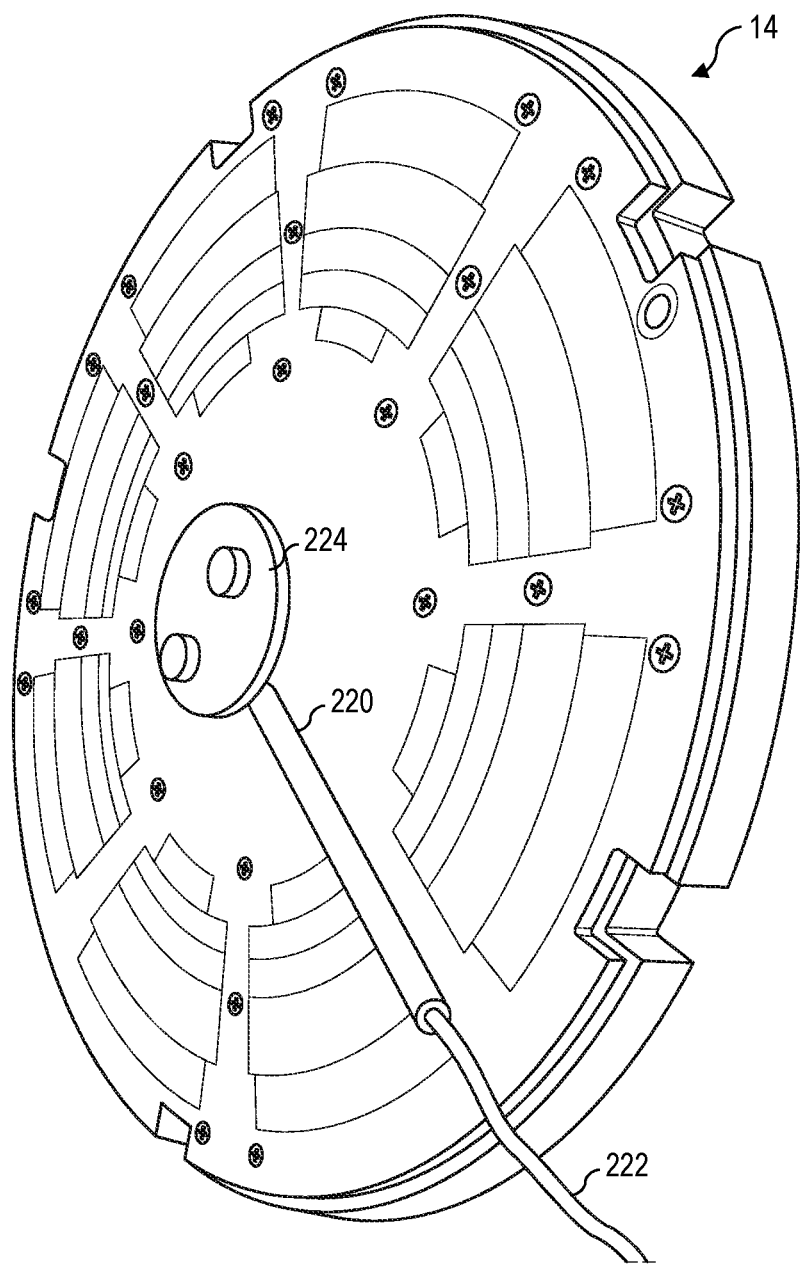
FIG. 9 depicts a schematic diagram illustrating an exemplary probe card, in accordance with an embodiment of the present invention.
Figure 10:
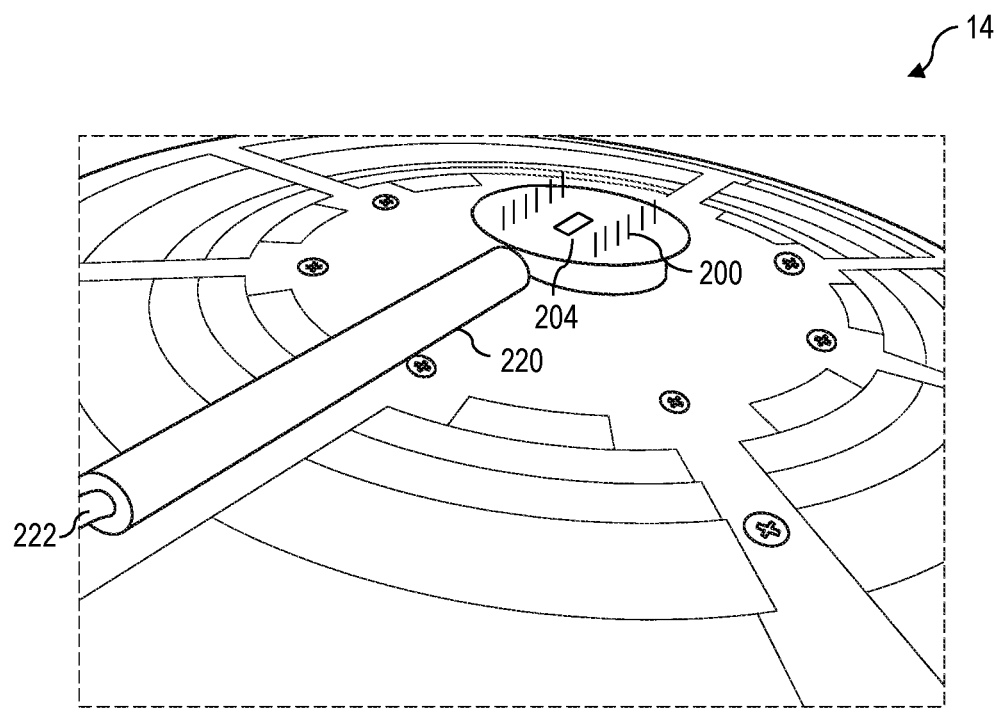
FIG. 10 depicts a schematic diagram illustrating details of an exemplary probe card, in accordance with an embodiment of the present invention.
Figure 11:
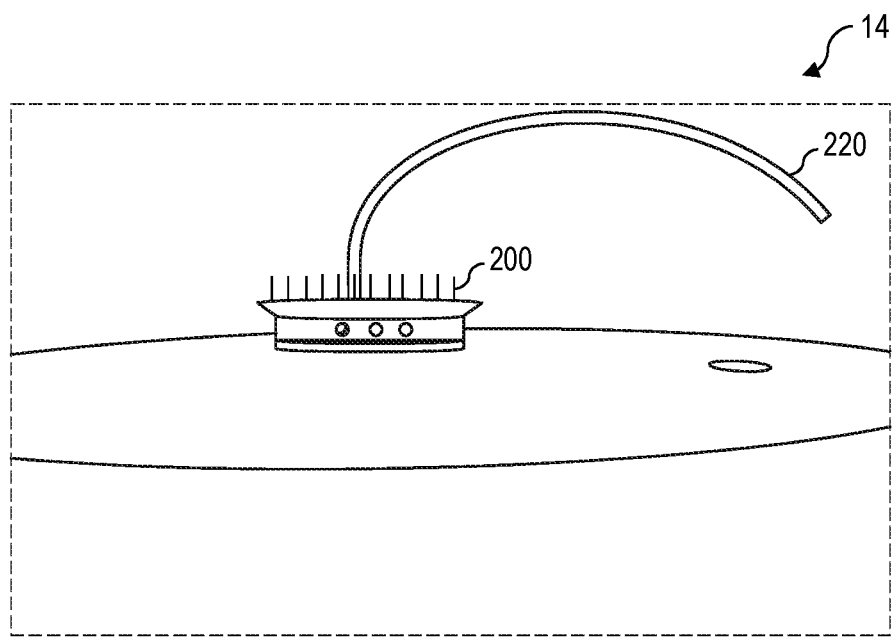
FIG. 11 depicts a schematic diagram illustrating details of an exemplary probe card, in accordance with an embodiment of the present invention.

FIG. 9 depicts a probe card 14 with a housing in form of a lead tube 220. One or more nuclear radiation sources may be arranged on wire 222 comprised by the lead tube 220. The wire 222 may be movable laterally and/or rotationally in the lead tube 220. By laterally and/or rotationally moving the wire 222 in the lead tube 220, nuclear radiation sources may be aligned with apertures. For example, the wire 222 may be coated with different nuclear radiative sources along the longitudinal direction. In FIG. 9, the electrical contacts 200 of the probe card are covered with a cap 224. FIG. 10 and FIG. 11 provide detailed view of portions of the probe card 14 of FIG. 9 with the lead tube 220 and/or the wire 222. In FIG. 10 and FIG. 11 cap 224 is removed showing electrical contacts 200 (e.g., in form of needles) to contact integrated circuits on a wafer under test. In addition, one or more apertures 204 can be adjacent to the electrical contacts 200.

Figure 12:
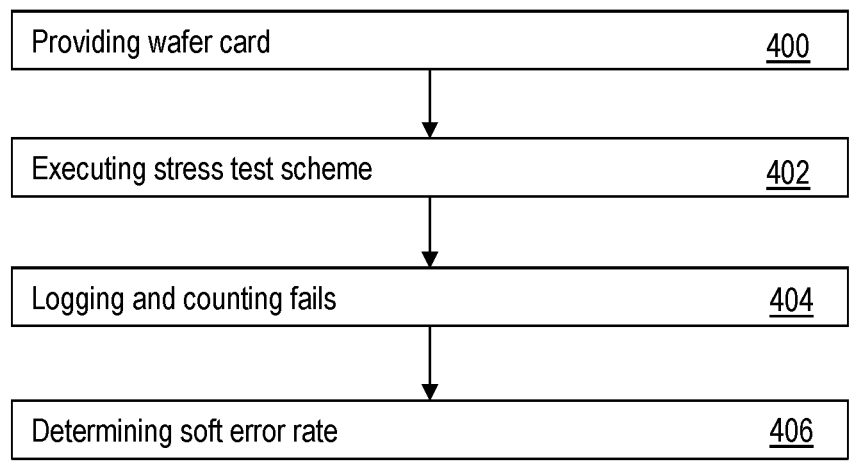
FIG. 12 depicts a schematic flow diagram of an exemplary method for performing a nuclear radiation stress test of data storage structures, in accordance with an embodiment of the present invention.

FIG. 12 depicts a schematic flow diagram of an example method for performing a nuclear radiation stress test of data storage structures according to an embodiment of the present invention. In an example embodiment, the computer system 100 (previously described in further detail with regard to FIG. 2) operates to execute the example method for performing a nuclear radiation stress test of data storage structures (of FIG. 12.) according to various embodiments of the present invention.

In step 400, the example method provides a probe card that includes a retaining element retaining one or more nuclear radiation sources. For example, the probe card may be mounted to a test board of a wafer prober. The retaining element can include one or more apertures for applying nuclear radiation from the one or more nuclear radiation sources to data storage structures of a wafer under test.

In step 402, the example method executes a stress test scheme. The nuclear radiation applied via one or more apertures to the data storage structures is controlled during the execution of the stress test scheme. The application of the nuclear radiation may be controlled by varying of relative positions of the one or more nuclear radiation sources and the one or more apertures. In step 404, the example method logs and counts failures of the data storage structures occurring during the executing of the stress test scheme under nuclear radiation from the one or more nuclear radiation sources. In step 406, the example method determines a soft error rate (SER) of the integrated circuits under test using the counted fails of the data storage structures occurring during the executing of the stress test scheme. In another example, the example method determines a statistical error rate.

Figure 13:
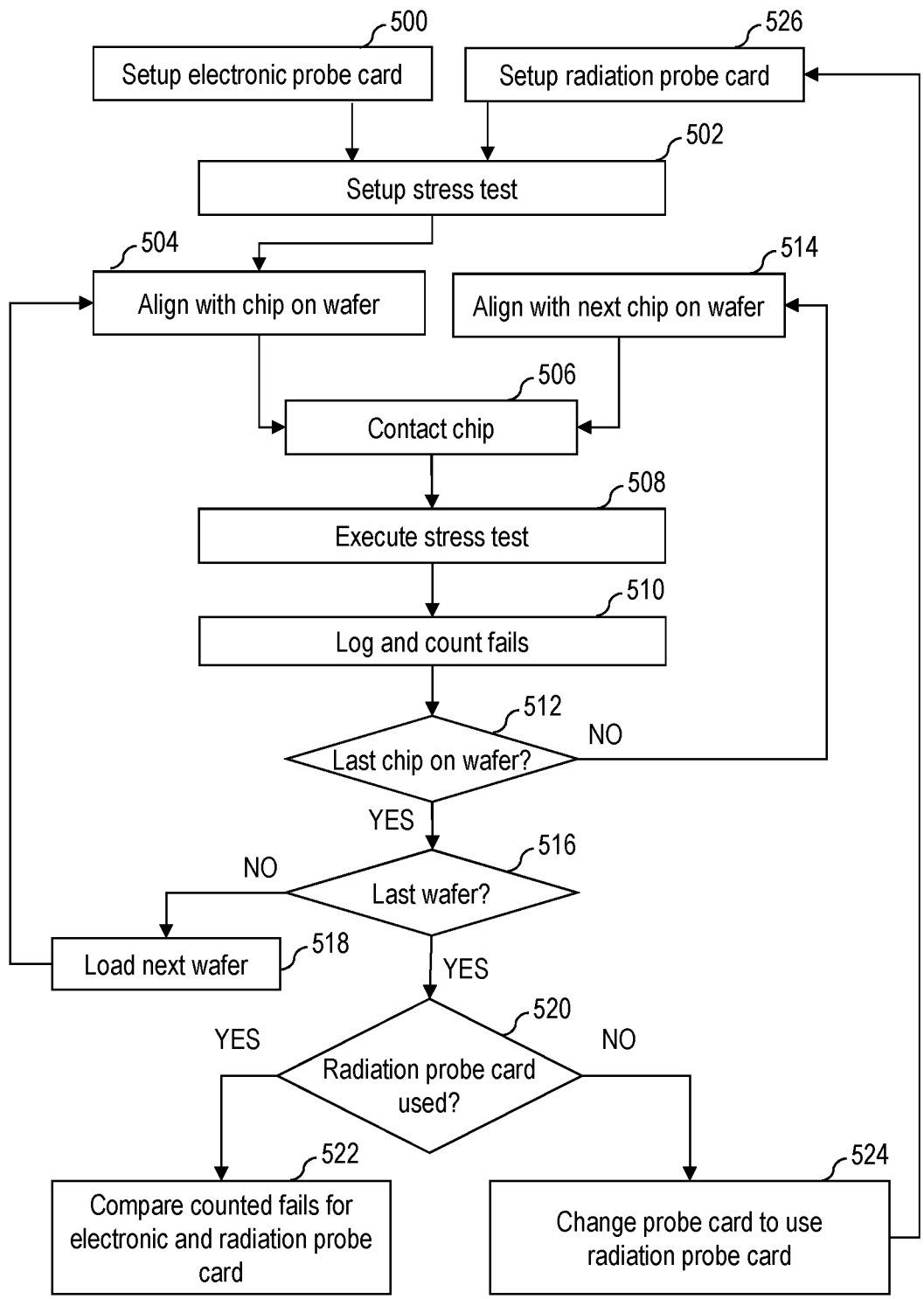
FIG. 13 depicts a schematic flow diagram of an exemplary method for performing a nuclear radiation stress test of data storage structures, in accordance with an embodiment of the present invention.

FIG. 13 depicts a schematic flow diagram of a further example method for performing a nuclear radiation stress test of data storage structures according to an embodiment of the present invention. In an example embodiment, the computer system 100 (previously described in further detail with regard to FIG. 2) operates to execute the example method for performing a nuclear radiation stress test of data storage structures (of FIG. 13.) according to various embodiments of the present invention.

In step 500, the example method includes setting-up an electronic probe card (i.e., a nuclear radiation sources free probe card). In step 502, the example method includes setting up the stress test. In step 504, the example method includes aligning a chip on the wafer with the probe card. In an alternate embodiment, in step 504, the example method includes aligning the probe card with the chip on the wafer. In step 506, the example method includes establishing electrical contact of the electronic probe card with the chip provided on the wafer under test.

In step 508, the example method includes executing the stress test according to a stress test scheme for the chip (contacted in step 506). For example, the stress test may include a retention test using a predefined time, voltage and/or temperature. In step 510, the example method includes logs and counts failures of the data storage structures occurring during the executing of the stress test using the stress test scheme.

In step 512, the example method includes determining whether the current chip under test is the last chip on the wafer. In response to determining that the current chip is the last chip on the wafer (step 512, YES branch), the example method continues with step 516. In response to determining that the current chip is not the last chip on the wafer (step 512, NO branch), the example method continues with step 514. In step 514, the example method includes aligning the next chip on the wafer is aligned with the probe card. In an alternate embodiment, in step 514, the example method includes aligning the probe card with the next chip on the wafer.

In step 516, the example method includes determining whether the wafer under test is the last wafer to be tested. In response to determining that the wafer under test is not the last wafer to be tested (step 516, NO branch), the example method includes loads the next wafer (in step 518). In response to determining that the wafer under test is the last wafer (step 516, YES branch), the example method continues with step 520.

In step 520, the example method includes determining whether the radiation probe card (i.e., a probe card comprising nuclear radiation sources for performing a nuclear radiation stress test), has already been used for testing the current wafer under test. In response to determining that the radiation probe card has already been used for testing the current wafer under test (step 520, YES branch), the example method continues with step 522. In step 522, the example method includes compares the counted failures for electronic and radiation probe card in order to derive a soft error rate.

In response to determining that the radiation probe card has already been used for testing the current wafer under test (step 520, NO branch), the example method continues with step 524. In step 524, the example method includes temporarily replacing the electronic probe card with a radiation probe card. In step 526, the example method includes setting up the radiation probe card. In response to setting up the radiation probe card, the example method can execute the stress test again, using the radiation probe card instead of the electronic probe card. The radiation probe card can include the same electronic elements as the electronic probe card, and additionally include a retaining element with one or more nuclear radiation sources.

According to alternative embodiments, the example method can perform the stress test without nuclear radiation and the stress test with nuclear radiation, with the radiation probe card. Accordingly, replacing of probe cards may not be necessary. For the stress test without nuclear radiation, the nuclear radiations sources are arranged in a parking position (i.e., unaligned with the apertures), such that no radiation is emitted from the retaining element.

It is understood that one or more of the aforementioned embodiments of the invention may be combined as long as the combined embodiments are not mutually exclusive. Ordinal numbers, like e.g. 'first', 'second' and 'third', are used herein to indicate different element assigned with the same name, but do not necessarily establish any order of the respective elements, unless otherwise indicated.

The present invention may be a system, a method, and/or a computer program product at any possible technical detail level of integration. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the blocks may occur out of the order noted in the Figures. For example, two blocks shown in succession may, in fact, be accomplished as one step, executed concurrently, substantially concurrently, in a partially or wholly temporally overlapping manner, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

What is claimed is:

1. A test device for a wafer prober, the test device comprising:
   a retaining element, retaining one or more nuclear radiation sources for performing a nuclear radiation stress test of data storage structures of integrated circuits on a wafer in the wafer prober;
   the retaining element comprising one or more apertures for applying nuclear radiation from the one or more nuclear radiation sources to the data storage structures; and
   the retaining element being configured for controlling the nuclear radiation applied via the one or more apertures, the controlling comprising a varying of relative positions of the one or more nuclear radiation sources and the one or more apertures.

2. The test device of claim 1, wherein the retaining element further comprises:
   a housing, the housing comprising a shielding material configured for shielding the nuclear radiation from the one or more nuclear radiation sources; and
   the one or more apertures being provided in the housing.

3. The test device of claim 1, wherein the retaining element provides different levels of attenuation for attenuating the nuclear radiation from the one or more nuclear radiation sources.

4. The test device of claim 1, wherein the retaining element retains the one or more nuclear radiation sources at different distances perpendicularly to a plane in which the at one or more apertures being arranged.

5. The test device of claim 1, wherein the nuclear radiation radiated from the one or more nuclear radiation sources comprises one or more radiation types selected from the group consisting of: α-radiation, β-radiation, γ-radiation.

6. The test device of claim 1, wherein the retaining element comprises a support element for supporting the one or more nuclear radiation sources.

7. The test device of claim 6, wherein the support element with the one or more nuclear radiation sources is movable within a housing relative to the one or more apertures.

8. The test device of claim 6, wherein at least a segment of the housing comprising the one or more apertures is movable relative to the support element with the one or more nuclear radiation sources.

9. The test device of claim 6, wherein the one or more nuclear radiation sources is provided by a powder of one or more nuclear radiative materials sticking to a sticking element adhering to the support element.

10. The test device of claim 6, wherein the support element is a wire.

11. The test device of claim 6, wherein the support element further comprises:
    a support surface, the one or more nuclear radiation sources being arranged on the support surface according to a first pattern matching a second pattern of an arrangement of the data storage structures on the wafer.

12. The test device of claim 11, wherein the support surface further comprises:
    a checkerboard structure, the checkerboard structure comprising a plurality of confined fields, the confined fields of the checkboard structure being selectively filled with the one or more nuclear radiation sources according to the first pattern.

13. The test device of claim 11, wherein the one or more apertures are arranged according to a third pattern matching the second pattern of the arrangement of the data storage structures on the wafer.

14. The test device of claim 1, wherein the retaining element further comprises:
    a probe card, with electrical contacts configured for establishing an electrical connection with electrical contacts of the integrated circuits on the wafer.

15. The test device of claim 1, wherein the test device further comprises an air flow system configured for extracting powder particles escaping from the one or more nuclear radiation sources with a filter configured for capturing the extracted powder particles.

16. The test device of claim 1, wherein the test device further comprises:
- a wafer prober, the wafer prober comprising a computer system for controlling the wafer prober to perform the nuclear radiation stress test;
- the computer system comprising a processor and a memory storing program instructions, wherein execution of the program instructions by the processor causes the processor to control the wafer prober to:
  - execute a stress test scheme, by applying the nuclear radiation via the one or more apertures during the executing of the stress test scheme being controlled, wherein the controlling further comprises the varying of relative positions of the one or more nuclear radiation sources and the one or more apertures;
  - logging and counting failures of the data storage structures occurring during the executing of the stress test scheme; and
  - determining a soft error rate of integrated circuits under test using the counted fails of the data storage structures occurring during the executing of the stress test scheme.

17. A method for performing a nuclear radiation stress test of data storage structures of integrated circuits on a wafer in a wafer prober, the method comprising:
- providing a probe card comprising a retaining element retaining one or more nuclear radiation sources, wherein the retaining element further comprises one or more apertures for applying nuclear radiation from the one or more nuclear radiation sources to the data storage structures;
- executing, by one or more processors, a first stress test scheme, by applying the nuclear radiation via the one or more apertures during the executing of the first stress test scheme being controlled, wherein the controlling further comprises varying of relative positions of the one or more nuclear radiation sources and the one or more apertures;
- logging and counting fails of the data storage structures occurring during execution of the first stress test scheme; and
- determining a soft error rate of integrated circuits under test using the counted fails of the data storage structures occurring during the executing of the first stress test scheme.

18. The method of claim 17, wherein the data storage structures further comprise one or more structures selected from the group consisting of: a latch, a register file, and a random-access memory cell.

19. The method of claim 17, further comprising:
- providing a nuclear radiation sources free probe card;
- executing a second stress test scheme; and
- logging and counting fails of the data storage structures occurring during the executing of the second stress test scheme, wherein the determining of the soft error rate of the integrated circuits under test further comprises using the counted fails of the data storage structures occurring during the executing of the second stress test scheme.

20. A computer program product for performing a nuclear radiation stress test of data storage structures of integrated circuits on a wafer in a wafer prober, the wafer prober being provided with a test device comprising a retaining element retaining one or more nuclear radiation sources, the retaining element comprising one or more apertures for applying nuclear radiation from the one or more nuclear radiation sources to the data storage structures, the computer program product comprising:
- one or more computer readable storage device and program instructions stored on the one or more computer readable storage device, the program instructions executable by a processor of the wafer prober to cause the wafer prober to:
- execute a stress test scheme, by applying the nuclear radiation via the one or more apertures during the executing of the stress test scheme being controlled, wherein the controlling further comprises a varying of relative positions of the one or more nuclear radiation sources and the one or more apertures;
- logging and counting fails of the data storage structures occurring during the executing of the stress test scheme; and
- determining a soft error rate of integrated circuits under test using the counted fails of the data storage structures occurring during the executing of the stress test scheme.

* * * * *